United States Patent
Brandt

(10) Patent No.: US 6,424,212 B1
(45) Date of Patent: Jul. 23, 2002

(54) POWER AMPLIFIERS

(75) Inventor: Per-Olof Brandt, Staffanstorp (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/716,610

(22) Filed: Nov. 20, 2000

(30) Foreign Application Priority Data

Nov. 25, 1999 (GB) ................................ 9927912

(51) Int. Cl.$^7$ ................................ H03G 3/20
(52) U.S. Cl. ................................ 330/140; 330/136
(58) Field of Search ................................ 330/136, 140, 330/285

(56) References Cited

U.S. PATENT DOCUMENTS

| | | | |
|---|---|---|---|
| 3,210,670 A | 10/1965 | Jones et al. | 329/205 |
| 3,900,823 A | * 8/1975 | Sokal et al. | 330/149 |
| 5,105,164 A | * 4/1992 | Fisher et al. | 330/149 |
| 5,119,042 A | 6/1992 | Crampton et al. | 330/295 |
| 5,247,542 A | 9/1993 | Onodera et al. | 375/60 |
| 5,343,843 A | 9/1994 | Hamren | 123/425 |
| 5,420,536 A | 5/1995 | Faulkner et al. | 330/149 |
| 5,528,196 A | 6/1996 | Baskin et al. | 330/151 |
| 5,742,201 A | 4/1998 | Eisenberg et al. | 330/2 |
| 5,909,129 A | 6/1999 | Murphy | 327/3 |

FOREIGN PATENT DOCUMENTS

| | | | | |
|---|---|---|---|---|
| EP | 366265 | * | 2/1990 | 330/149 |
| EP | 0 366 265 | | 5/1990 | |
| EP | 0 441 580 A2 | | 8/1991 | |
| EP | 0 526 241 A2 | | 2/1993 | |
| EP | 0 603 867 A1 | | 6/1994 | |
| GB | 2 163 311 A | | 2/1986 | |
| JP | 55039469 A | | 3/1980 | |
| JP | 62078902 A | | 4/1987 | |
| JP | 4100303 A | | 4/1992 | |
| WO | WO 98/00907 | | 1/1998 | |

OTHER PUBLICATIONS

U. Güttich et al. "A Low Noise Heterodyne 89 GHZ MMIC Module For The Multifrequency Imaging Microwave Radiometer (MIMR)". IEEE 1996 Microwave and Millimeter—Wave Monolithic Circuits Symposium. XP 000683214. pp. 145–148.

Search Report as Conducted by World Patent Technology Searches and Consulting on Aug. 16, 1999.

Search Report as Conducted by the United Kingdom Patent Office in connection with GB 9927912.7, as completed by D. Midgley on Mar. 16, 2000.

International Search Report as Completed by ISA/EP on Apr. 25, 2001, in connection with PCT/EP00/10938.

* cited by examiner

Primary Examiner—Robert Pascal
Assistant Examiner—Henry Choe
(74) Attorney, Agent, or Firm—Jenkens & Gilchrist, P.C.

(57) ABSTRACT

A circuit for controlling the characteristics of a power amplifier including first and second inputs, a first amplitude detection circuit for producing a first output signal indicative of the amplitude of an input signal received from the first input, and a second amplitude detection circuit for producing a second output signal indicative of the amplitude of an input signal received from the second input. The circuit also includes a phase detection circuit for producing a phase signal indicative of the relative phase between the input signals supplied to the first and second inputs, an amplitude control circuit for receiving the outputs of the first and second amplitude detection circuits and producing an amplitude control signal therefrom, and a phase control circuit for receiving the output of the phase detection circuit and producing a phase control signal therefrom.

8 Claims, 2 Drawing Sheets

POWER AMPLIFIERS

FIELD OF THE INVENTION

The present invention relates to power amplifiers.

BACKGROUND OF THE INVENTION

In the new EDGE (Enhanced Data Rates for GSM Evolution) modulation scheme for mobile communications networks amplitude, as well as frequency, varies and is part of the modulation. This means that a power amplifier (PA) has to have constant gain rather than constant output power. This is currently the case in GSM (Global System for Mobile Communications) where the amplitude is constant and the information is all in phase.

In the EDGE modulation scheme, since the power amplifier will be non-linear at high output powers both the gain and the phase will be distorted at those high output power.

Of the distortion intermodulation products, the third order (IM3) is the most severe. More information can be found in "Microwave Transistor Amplifiers" by Guillermo Gonzalez, 1984 edition, P.178, ISBN 0-13-581646-7. In EDGE, the IM3 product is likely to be required to be <-40 dBc. This is a very difficult specification to meet if a power amplifier is conventionally biassed for linear operation. In the US D-AMPS system the requirement is -28 dBc, and so in D-AMPS even a class AB (very close to class B operation) power amplifier can fulfill the specification. A conventionally biassed EDGE power amplifier would need to be biassed closer to class A to achieve the specification.

However, a class A biassed EDGE power amplifier will also draw current when the amplitude is low during modulation compared to a D-AMPS power amplifier where the current would decrease quite a bit when the lower amplitude is to be transmitted. If the average efficiency is compared then the D-AMPS power amplifier would get almost as high an efficiency as a saturated GSM power amplifier. An EDGE power amplifier would on the other hand have a very low average efficiency.

If the efficiency at maximum output power is considered, however, then an EDGE power amplifier has very high efficiency. The reason that this does not show in the average efficiency is that maximum output power is used only for a very short proportion of the operating time of the power amplifier.

It is therefore desirable to bias the power amplifier in such a way that it can be kept as close to saturation as possible for all output power levels.

There are many known different ways of linearising a power amplifier. Many of these are based on feed back and feed forward at radio frequency and are very sensitive to component variations. U.S. Pat. No. 5,742,201 describes a systems in which the feedback takes place at lower frequency than the radio frequency transmission signal.

It is desirable to provide a bias circuit for a power amplifier which can overcome the disadvantages of the previously considered solutions, with a minimum amount of complexity.

SUMMARY OF THE PRESENT INVENTION

According to one aspect of the present invention, there is provided a circuit for controlling the characteristics of a power amplifier comprising:

first and second inputs;

a first amplitude detection circuit having an input and an output, the input being connected to the first input, and the first detection circuit being operable to produce a first output signal indicative of the amplitude of an input signal received at its input;

a second amplitude detection circuit having an input and an output, the input being connected to the second input, and the second detection circuit being operable to produce a second output signal indicative of the amplitude of an input signal received at its input;

a phase detection circuit having an input and an output, the input being connected to each of the first and second inputs, and being operable to produce a phase signal indicative of the relative phase between input signal supplied to the first and second inputs;

an amplitude control circuit connected to receive the outputs of the first and second amplitude detection circuits and operable to produce an amplitude control signal therefrom; and a phase control circuit connected to receive the output of the phase detection circuit and operable to produce a phase control signal therefrom.

According to another aspect of the present invention, there is provided a-method of controlling a power amplifier comprising producing a first signal indicative of the amplitude of a high frequency input signal to the amplifier and a second signal indicative of the amplitude of a high frequency output signal from the amplifier, comparing the first and second signals to produce a comparison signal, and supplying the comparison signal to the power amplifier as a bias control signal.

In such a circuit the first amplitude detection circuit preferably includes a diode and a first resistor connected in parallel between the input of the detection circuit and ground, such that the diode is connected in reverse bias between the input and ground, a second resistor connected in series between the input and the output of the detection circuit, and a capacitor connected between the output of the detection circuit and ground.

The second amplitude detection circuit also preferably includes a diode and a third resistor connected in parallel between the input of the detection circuit and ground, such that the diode is connected in reverse bias between the input and ground, a fourth resistor connected in series between the input and the output of the detection circuit, and a capacitor connected between the output of the detection circuit and ground.

The phase detection circuit preferably comprises a diode connected in reverse bias between the input and ground, and wherein the input of the phase detection circuit is connected to the output thereof.

It is emphasised that the term "comprises" or "comprising" is used in this specification to specify the presence of stated features, integers, steps or components, but does not preclude the addition of one or more further features, integers, steps or components, or groups thereof.

DESCRIPTION OF THE PREFERRED EMBODIMENT

Figure 1:
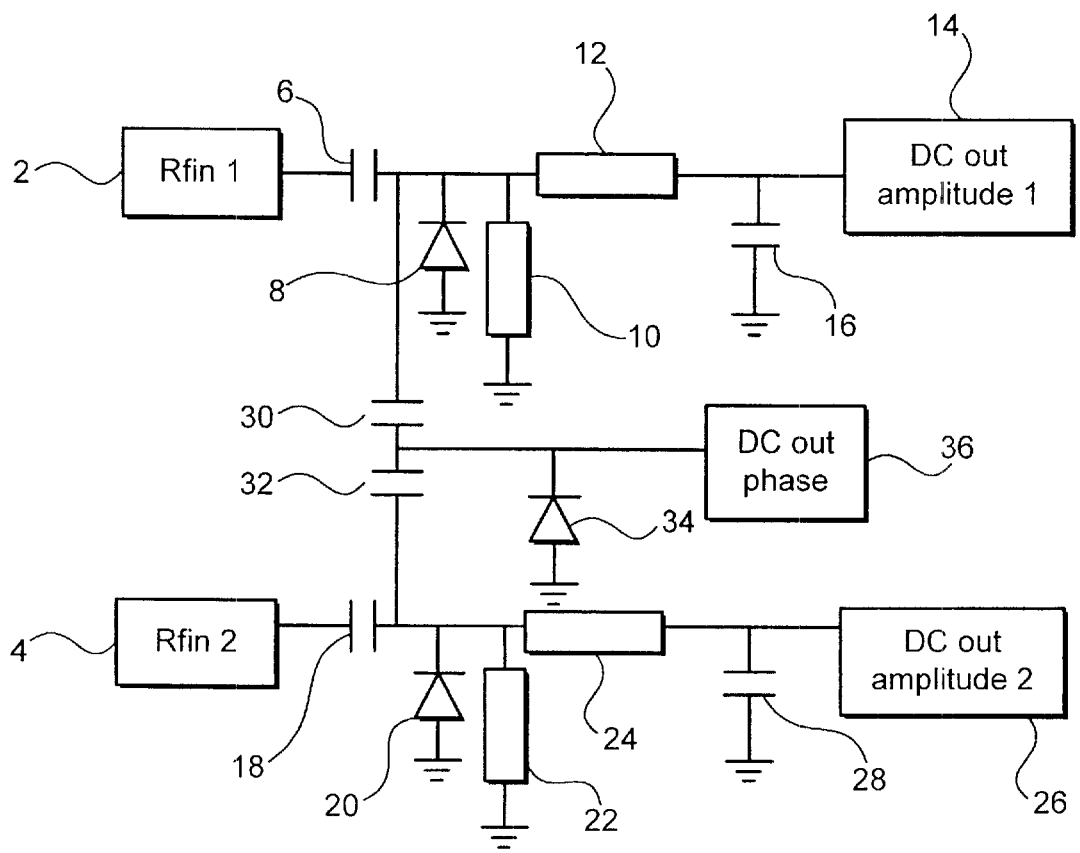
FIG. 1 is a block circuit diagram of a detecting circuit for use in an embodiment of the present invention.
Figure 2:
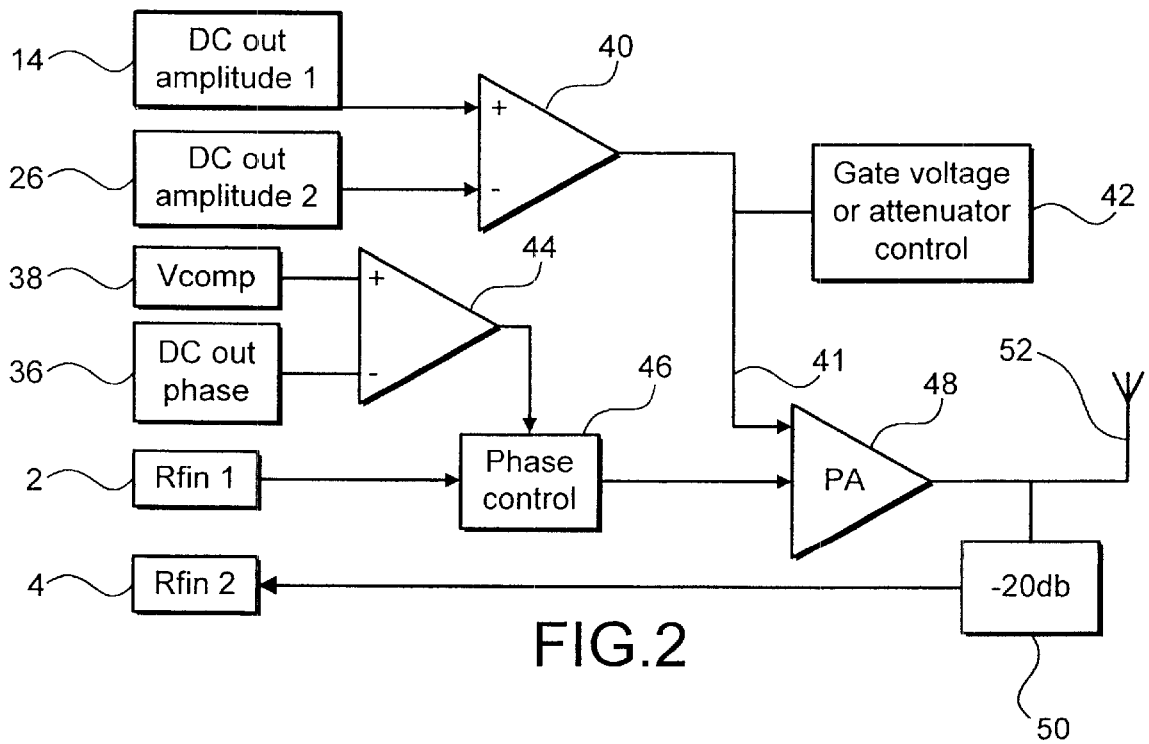
FIG. 2 is a block circuit diagram of a power amplifier circuit.

FIG. 1 illustrates an amplitude and phase detection circuit embodying one aspect of the present invention. FIG. 2 illustrates a power amplifier circuit which uses detection signals from the circuit of FIG. 1 to control the biassing of a power amplifier 48.

The circuit of FIG. 1 receives a first radio frequency signal Rfin1 at an input 2. This signal Rfin1 is taken from the radio frequency path of the transmitter using the circuitry. A coupling capacitor 6 couples the input 2 to a first amplitude detection circuit. The amplitude detection circuit comprises a Schottky diode 8 connected in reverse bias between the Rfin1 signal and ground. A resistor 10 is connected in parallel with the diode 8 between the Rfin1 signal line and ground. A resistor 12 is connected in series with the Rfin1 signal path to connect the path to an output 14 which provides an output signal (DC out amplitudes) indicating the amplitude of the first RF signal Rfin1. A smoothing capacitor 16 is connected between the output 14 and ground.

A second radio frequency signal Rfin2 is connected to the circuit by way of a second input 4. The second RF signal is an amplitude reduced sample of the amplified Rfin1 output signal. A sample of this output signal is used for comparison with the original Rfin1 signal in order-that the bias of the power amplifier 48 (FIG. 2) can be monitored.

The second RF signal Rfin2 is connected to a second amplitude detection circuit by way of a coupling capacitor 18. The second detection circuit is the same as the first, and comprises a reverse biassed Schottky diode 20 connected in parallel with a resistor 22 between the RF signal Rfin2 and ground. A resistor 24 is connected to the input 4 at one end thereof and to an output 26 at the other end thereof. A smoothing capacitor is provided between the output 26 and ground. The output 26 provides a signal (DC out amplitude2) indicative of the amplitude of the second RF signal Rfin2.

The first and second inputs are connected, via additional coupling capacitors 30 and 32 respectively to the cathode of a third Schottky diode 34. The anode of the diode 34 is connected to ground, such that the diode 34 is connected in reverse bias between the inputs and ground. The cathode of the diode 34 provides a third output 36 of the circuit which serves to provide a signal indicative of the relative phases of the two input RF signals Rfin1 and Rfin2.

The third output 36 (DC out phase) will reach a maximum magnitude (in this case a negative voltage) when the input signals, which are almost equal in amplitude, are in phase with one another. It will be readily appreciated that any of the diodes can be connected in the opposite manner to that described. In that case, the third output 36 would reach a maximum positive value.

Referring to FIG. 2, the power amplifier 48 is connected to receive an attenuation control signal 41 from the output of a comparator 40 and a gate voltage or attenuator controller 42. The comparator 40 receives the first and second output signals 14 and 26 from the circuit of FIG. 1, as its respective two inputs. The controller 42 serves to adjust the signal 41. so that the gain of the power amplifier is controlled to remains constant. This gain control signal is supplied directly to the power amplifier as a bias signal in a preferred embodiment of the invention.

Keeping the gain of the power amplifier constant will only improve linearity to the point where either the compensation will generate more phase distortion than it takes away, or amplitude distortion or phase distortion will be generated anyway.

Therefore, in order to improve further the performance the phase should also be linearised. In FIG. 1, the two inputs Rfin1 and Rfin2 are connected, via respective coupling capacitors 30 and 32, to the cathode of a third Schottky diode 34. The anode of the third diode 34 is connected to ground. The cathode of the third diode provides a third output 36 which supplies an output signal DC out phase indicative of the phase difference between the two input signals.

Since the third diode has non-linear behaviour, the phase detector gets high phase resolution. If the content of harmonics is lower than —30 dB the signals are very close to perfect sine waves. This means that there is only one maximum and this happens when the signals are in phase.

Phase control of the power amplifier 48 (FIG. 2) is achieved by comparing the third output signal 36 with a reference voltage (Vcomp) 38 using a comparator 44. The output of the comparator 44 is connected to a phase control unit 46 which operates to adjust the phase of the RF signal Rfin1, before passing the phase adjusted signal to the power amplifier 48. The phase controller is preferably a varactor.

A normal-phase:detector detects the amplitude of two added voltages, one reference phase and two quadrature voltages and detected the difference between the detected voltages. In the present invention, however, with the reference voltage Vcomp being given an appropriate value the detector provides a half quadrature detector. An appropriate value for the reference voltage Vcomp could be a modified value of the first output signal 14 (DC out amplitude 1), indicative of the amplitude information. This signal can be modified such that the signal is of the same size when the third output signal indicates that the two RF signals are out of phase by 90 degrees. The output voltage from the comparator 44 is an odd function.

Another way to make it possible to use the "DC out phase" detected phase signal and get an odd function is to first differentiate the "DC out phase" signal. The derivative is then input to the comparator 44. The comparator 44 is preferably realised as a PI-regulator.

It is then possible to always have Vcomp set to reference ground. Then the phase control unit 46 will regulate the phase difference to the zero degrees difference, when the derivative is zero.

Since the PI part of the regulator will set the bandwidth together with the gain in the D-AMPS system there will be higher bandwidth at high input powers to the detector than for lower input levels. This is no disadvantage in the linearisation of a power amplifier, since it means that at high output powers where the phase error in the PA is the highest also the regulator loop is the fastest and therefore will be able to compensate for the errors. At lower output power the bandwidth, because the input signal is lower, will be lower which is also good since there is no need for as much compensation since the PA is more linear anyway. At low output powers the regulator would only degrade the linearity if there is also high bandwidth.

Since all measurements are differential this method is inherently insensitive to temperature and supply voltage variations.

It will be readily appreciated that the diodes described above may be connected in opposite polarity to that described; i.e. the reverse bias connection can be made forward bias.

Figure 3:
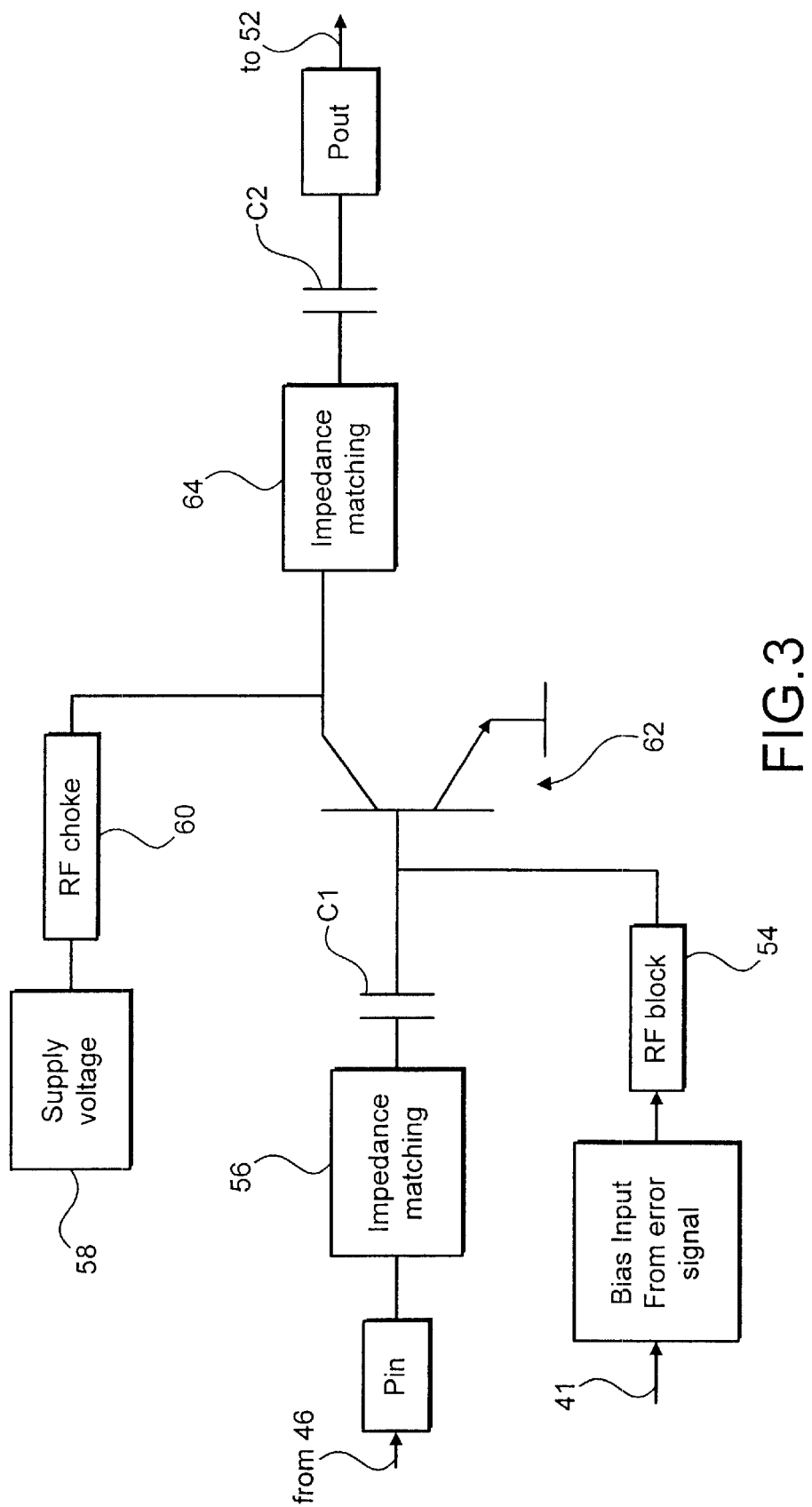
FIG. 3 illustrates a power amplifier.

A preferred embodiment of power amplifier is illustrated in FIG. 3. The amplifier comprises a transistor 62 which is connected to a supply voltage 58 via an RF choke 60, and to ground. The collector terminal of the transistor is connected to an output $P_{out}$ via an impedance matching circuit 64 and a coupling capacitor C2. The input (base) terminal of the transistor is connected to receive an input signal from the phase controller 46 of FIG. 2 via an impedance matching circuit 56 and a coupling capacitor C1. As is known, the transistor 62 operates to amplify the signal supplied to its input to provide an amplified signal at its output. To the input terminal is connected the bias signal 41 from the power amplifier control circuit of FIGS. 1 and 2. The bias signal 41 is connected via an RF blocking circuit 54, so that stray RF signals are not transmitted to the input terminal.

It can therefore be seen that the bias signal 41 produced by the circuits of FIGS. 1 and 2 is supplied to the transistor of the power amplifier directly to its signal input terminal as a bias voltage. It will be readily appreciated that the transistor 62 can be provided by any suitable transistor, for example an FET transistor. In such a case, the drain terminal of the FET transistor provides the amplified signal output, and the gate terminal provides the signal input.

What is claimed is:

1. A circuit for controlling the characteristics of a power amplifier comprising:

first and second inputs;

a first amplitude detection circuit having an input and an output, the input being connected to the first input, the first amplitude detection circuit including a first diode and a first resistor connected in parallel between the input of the first detection circuit and ground, such that the first diode is connected in reverse bias between the input and ground, a second resistor connected in series between the input and the output of the first detection circuit, and a first capacitor connected between the output of the first detection circuit and ground;

a second amplitude detection circuit having an input and an output, the input being connected to the second input, the second amplitude detection circuit including a second diode and a third resistor connected in parallel between the input of the second detection circuit and ground, such that the second diode is connected in reverse bias between the input and ground, a fourth resistor connected in series between the input and the output of the second detection circuit, and a second capacitor connected between the output of the second detection circuit and ground;

a phase detection circuit having an input and an output, the input being connected to each of the first and second inputs, the input of the phase detection circuit being connected to the output thereof, and phase detection circuit comprising a third diode connected in reverse bias between the input and ground;

an amplitude control circuit connected to receive the outputs of the first and second amplitude detection circuits and operable to produce an amplitude control signal therefrom; and a phase control circuit connected to receive the output of the phase detection circuit and operable to produce a phase control signal therefrom, wherein the amplitude control signal is for supply to a power amplifier as a bias control signal therefore.

2. A circuit for controlling the characteristics of a power amplifier comprising:

first and second inputs;

a first amplitude detection circuit having an input and an output, the input being connected to the first input, and the first detection circuit being operable to produce a first output signal indicative of the amplitude of an input signal received at its input;

a second amplitude detection circuit having an input and an output, the input being connected to the second input, and the second detection circuit being operable to produce a second output signal indicative of the amplitude of an input signal received at its input;

a phase detection circuit having an input and an output, the input being connected to each of the first and second inputs, and being operable to produce a phase signal indicative of the relative phase between input signal supplied to the first and second inputs;

an amplitude control circuit connected to receive the outputs of the first and second amplitude detection circuits and operable to produce an amplitude control signal therefrom; and a phase control circuit connected to receive the output of the phase detection circuit and operable to produce a phase control signal therefrom, wherein the amplitude control signal is for supply to a power amplifier as a bias control signal therefore.

3. A circuit as claimed in claim 2, wherein the first amplitude detection circuit including a first diode and a first resistor connected in parallel between the input of the first detection circuit and ground, such that the first diode is connected in reverse bias between the input and ground, a second resistor connected in series between the output and the output of the first detection circuit, and a first capacitor connected between the output of the first detection circuit and ground.

4. A circuit as claimed in claim 3, wherein the second amplitude detection circuit including a second diode and a third resistor connected in parallel between the input of the second detection circuit and ground, such that the second diode is connected in reverse bias between the input and ground, a fourth resistor connected in series between the input and the output of the second detection circuit, and a second capacitor connected between the output of the second detection circuit and ground.

5. A circuit as claimed in claim 4, wherein the phase detection circuit comprises a third diode connected in reverse bias between the input and ground, and wherein the input of the phase detection circuit is connected to the output thereof.

6. A circuit as claimed in claim 2, wherein the first amplitude detection circuit including a first diode and a first resistor connected in parallel between the input of the first detection circuit and ground, such that the first diode is connected in forward bias between the input and ground, a second resistor connected in series between the input and the output of the first detection circuit and a first capacitor connected between the output of the first detection circuit and ground.

7. A circuit as claimed in claim 6, wherein the second amplitude detection circuit including a second diode and a third resistor connected in parallel between the input of the second detection circuit and ground, such that the second diode is connected in forward bias between the input and ground, a fourth resistor connected in series between the input and the output of the second detection circuit, and a second capacitor connected between the output of the second detection circuit and ground.

8. A circuit as claimed in claim 7, wherein the phase detection circuit comprises a third diode connected in forward bias between the input and ground, and wherein the input of the phase detection circuit is connected to the output thereof.

* * * * *

UNITED STATES PATENT AND TRADEMARK OFFICE
CERTIFICATE OF CORRECTION

PATENT NO. : 6,424,212 B1 Page 1 of 1
DATED : July 23, 2002
INVENTOR(S) : Per-Olof Brandt It is certified that error appears in the above-identified patent and that said Letters Patent is hereby corrected as shown below:

Column 3,
Line 14, replace "(DC out amplitudes)" with -- (DC out amplitude1) --

Signed and Sealed this

Eleventh Day of March, 2003

JAMES E. ROGAN
*Director of the United States Patent and Trademark Office*